United States Patent [19]
Burns

[11] Patent Number: 5,828,125
[45] Date of Patent: *Oct. 27, 1998

[54] ULTRA-HIGH DENSITY WARP-RESISTANT MEMORY MODULE

[75] Inventor: Carmen D. Burns, Austin, Tex.

[73] Assignee: Staktek Corporation, Austin, Tex.

[*] Notice: The term of this patent shall not extend beyond the expiration date of Pat. No. 5,644,161.

[21] Appl. No.: 758,839

[22] Filed: Dec. 2, 1996

Related U.S. Application Data

[63] Continuation of Ser. No. 473,593, Jun. 7, 1995, Pat. No. 5,644,161, which is a continuation-in-part of Ser. No. 280,968, Jul. 27, 1994, Pat. No. 5,581,121, which is a division of Ser. No. 37,830, Mar. 29, 1993, Pat. No. 5,369,056.

[51] Int. Cl.$^6$ .................. B44F 1/22; C23F 1/02
[52] U.S. Cl. .............. 257/668; 257/666; 257/672; 257/675; 257/676; 257/706; 257/707; 257/735; 257/777
[58] Field of Search ................. 257/666, 668, 257/669, 672, 675, 676, 686, 699, 706, 707, 735, 777

[56] References Cited

U.S. PATENT DOCUMENTS

| | | | |
|---|---|---|---|
| 3,436,604 | 4/1969 | Hyltin et al. | 317/101 |
| 3,614,546 | 10/1971 | Avins | 317/234 |
| 3,713,893 | 1/1973 | Shirland | 136/89 |
| 3,739,462 | 6/1973 | Hasty | 29/577 |
| 4,030,080 | 6/1977 | Burkett et al. | 340/172.5 |
| 4,103,318 | 7/1978 | Schwede | 361/388 |
| 4,158,745 | 6/1979 | Keller | 174/52 FP |
| 4,241,493 | 12/1980 | Andrulitis et al. | 290/572 |
| 4,288,841 | 9/1981 | Gogal | 361/414 |
| 4,321,418 | 3/1982 | Dran et al. | 136/251 |
| 4,437,235 | 3/1984 | McIver | 29/840 |
| 4,451,973 | 6/1984 | Tateno et al. | 29/588 |
| 4,521,828 | 6/1985 | Fanning | 361/386 |

(List continued on next page.)

FOREIGN PATENT DOCUMENTS

| | | |
|---|---|---|
| 5731166 | 2/1982 | Japan . |
| 5896756A | 6/1983 | Japan . |
| 58112348 | 7/1983 | Japan . |
| 61-163652(A) | 1/1985 | Japan . |
| 60180150A | 9/1985 | Japan . |
| 63153849 | 6/1988 | Japan . |
| 63-53959 | 8/1988 | Japan . |
| 3-125440 | 5/1991 | Japan . |
| 4-207061 | 7/1992 | Japan . |

OTHER PUBLICATIONS

Information allegedly written by Emory Garth regarding "Memory Stacks," Applicants received a facsimile from Emory Garth on Jan. 26, 1993, Applicant does not know when this information was written or its validity.

Catalog of Dese–Pac Microsystems, Inc. describing two products: DPS512×16A3 Ceramic 512K×16 CMOS SRAM MODULE and DPS512×16AA3 High Speed Ceramic 512K×16 CMOS SRAM MODULE, pp. 865–870.

Primary Examiner—Tom Thomas
Assistant Examiner—Fetsum Abraham
Attorney, Agent, or Firm—Fulbright & Jaworski L.L.P.

[57] ABSTRACT

An ultra high-density integrated circuit module which includes a plurality of individual high-density integrated circuit packages. A plurality of the ultra high-density integrated circuit memory modules may be combined to form an ultra high-density memory bank for use in computers, or other applications requiring high-density on-board memory. The high-density integrated circuit packages which form the modules each have an internal lead frame and optional internal member which overlie an integrated circuit die. A thin, warp-resistant metal layer and an external heat conductor element are mounted to the exterior of the package. Heat is dissipated from the package while structural forces are selectively balanced.

4 Claims, 5 Drawing Sheets

U.S. PATENT DOCUMENTS

| | | | |
|---|---|---|---|
| 4,525,921 | 7/1985 | Carson et al. | 29/577 |
| 4,530,152 | 7/1985 | Roche et al. | 29/588 |
| 4,630,172 | 12/1986 | Stenerson et al. | 361/386 |
| 4,633,573 | 1/1987 | Scherer | 29/589 |
| 4,680,617 | 7/1987 | Ross | 357/72 |
| 4,684,975 | 8/1987 | Takiar et al. | 357/70 |
| 4,706,166 | 11/1987 | Go | 361/403 |
| 4,722,060 | 1/1988 | Quinn et al. | 364/490 |
| 4,733,461 | 3/1988 | Nakano | 29/830 |
| 4,763,188 | 8/1988 | Johnson | 357/74 |
| 4,764,846 | 8/1988 | Go | 361/388 |
| 4,771,366 | 9/1988 | Blake et al. | 361/387 |
| 4,796,078 | 1/1989 | Phelps Jr. et al. | 357/68 |
| 4,821,148 | 4/1989 | Kobayashi et al. | 361/392 |
| 4,823,234 | 4/1989 | Konishi et al. | 361/386 |
| 4,829,403 | 5/1989 | Harding | 361/386 |
| 4,833,568 | 5/1989 | Berhold | 361/383 |
| 4,839,717 | 6/1989 | Phy et al. | 357/74 |
| 4,855,868 | 8/1989 | Harding | 361/386 |
| 4,862,245 | 8/1989 | Pashby et al. | 357/70 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,891,789 | 1/1990 | Quattrini et al. | 365/63 |
| 4,948,645 | 8/1990 | Holzinger et al. | 428/40 |
| 4,953,005 | 8/1990 | Carlson et al. | 357/80 |
| 4,953,060 | 8/1990 | Lauffer et al. | 361/388 |
| 4,983,533 | 1/1991 | Go | 437/7 |
| 4,994,411 | 2/1991 | Naito et al. | 437/209 |
| 4,997,517 | 3/1991 | Parthasarathi | 156/630 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 357/80 |
| 5,065,277 | 11/1991 | Davidson | 361/383 |
| 5,086,018 | 2/1992 | Conru et al. | 437/207 |
| 5,089,876 | 2/1992 | Ishioka | 357/70 |
| 5,099,393 | 3/1992 | Bentlage et al. | 361/413 |
| 5,104,820 | 4/1992 | Go et al. | 437/51 |
| 5,108,553 | 4/1992 | Foster et al. | 205/125 |
| 5,134,463 | 7/1992 | Yamaguchi | 357/81 |
| 5,138,430 | 8/1992 | Gow, 3rd et al. | 357/70 |
| 5,138,434 | 8/1992 | Wood et al. | 357/74 |
| 5,139,969 | 8/1992 | Mori | 437/183 |
| 5,147,822 | 9/1992 | Yamazaki et al. | 437/215 |
| 5,151,559 | 9/1992 | Conru et al. | 174/52.4 |
| 5,155,068 | 10/1992 | Tada | 437/211 |
| 5,157,478 | 10/1992 | Ueda et al. | 357/72 |
| 5,214,845 | 6/1993 | King et al. | 29/841 |
| 5,216,283 | 6/1993 | Lin | 257/787 |
| 5,223,739 | 6/1993 | Katsumata et al. | 257/676 |
| 5,235,672 | 8/1993 | Carson | 395/24 |
| 5,279,991 | 1/1994 | Minahan et al. | 437/208 |
| 5,313,097 | 5/1994 | Ahmadi et al. | 257/706 |
| 5,347,428 | 9/1994 | Carson et al. | 361/760 |
| 5,367,766 | 11/1994 | Burns et al. | 29/848 |
| 5,644,161 | 7/1997 | Burns | 257/676 |

ULTRA-HIGH DENSITY WARP-RESISTANT MEMORY MODULE

SPECIFICATION

This application is a continuation of application Ser. No. 08/473,593, filed Jun. 7, 1995, U.S. Pat. No. 5,644,161 which is a continuation-in-part of application Ser. No. 08/280,968, filed Jul. 27, 1994, U.S. Pat. No. 5,581,121, which is a division of application Ser. No. 08/037,830, filed Mar. 29, 1993, U.S. Pat. No. 5,369,056.

1. FIELD OF THE INVENTION

This invention relates to an ultra-high density integrated circuit module. More particularly, this invention relates to an ultra-high density warp-resistant integrated circuit memory module having in-line leads.

2. DISCUSSION OF RELATED TECHNOLOGY

As computer systems, and other electronic equipment, become more complex, the never-ending need for smaller, higher density memory devices persists. One approach to achieving this desired goal is a high-density electronic module formed of a plurality of stacked integrated circuit memory die (chips) disposed within a casing, typically hermetically sealed, and placed on a substrate and/or lead frame connection to a printed circuit board. Examples of such high-density memory devices are described in U.S. Pat. Nos. 4,983,533, 5,104,820, 4,764,846, and 4,706,166, all of which are assigned to Irvine Sensors Corporation of Costa Mesa, Calif.

In some instances, utilizing modules of stacked integrated circuit memory devices disposed within a single enclosure provides inadequate thermal dissipation, resulting in overheating. Additionally, if one of the chips within the memory module fails during operation, the entire module must be disconnected from the circuit board, the hermetic enclosure removed and opened, the faulty chip replaced and the module reassembled and reconnected. Otherwise, to expedite trouble shooting, the entire module would need to be replaced, necessitating the costly replacement of an entire high-density memory module. The basic technology for an improved high-density integrated circuit package utilizing enhanced heat dissipation characteristics is described in application Ser. No. 07/990,334, filed Dec. 11, 1992, assigned to the assignee of the present invention.

In the past, one area of concentration for high density packaging has been memory devices such as SRAMs and DRAMs. Prior systems typically utilized a transfer molded plastic encasement surrounding the integrated circuit and having one of a variety of pin-out or mounting and interconnect schemes. The older M-DIPs (Dual-In-Line-Plastic) provides a relatively flat, molded package having dual parallel rows of leads extending from the bottom for through-hole connection and mounted to an underlying circuit board substrate. These packages provided 100 mil spacing between leads.

A more dense package was the 100 mil SIP (Single-In-Line-Plastic), which was assembled on edge with two rows of 100 mil staggered leads extending from the bottom edge for through-hole assembly. Another popular prior art package is the PLCC (Plastic Leaded Chip Carrier), SOJ (Small Outline J-leaded) molded package with twenty surface-mount designed J-leads (length 0.67", width 0.34", height 0.14").

Higher density versions of the SIMM (Single-In-Line Memory Module) design with even smaller versions of the DRAM plastic package have been developed. These thinner versions of SOJ DRAMs are one-half the thickness (having a plastic packaging thickness of about 70 mils) of standard SOJ designs, and have been mounted on both sides of circuit board substrates.

An example of a fabrication method and apparatus for lead-on chip integrated circuits having improved thermal dissipation characteristics is more fully described in U.S. Pat. No. 5,221,642; Patent Cooperative Treaty International Application No. PCT/US92/06778; and U.S. patent application Ser. No. 07/783,737, filed on Oct. 28, 1991, pending; each having the common assignee of the present invention.

SUMMARY OF THE INVENTION

The present invention is for an ultra high-density memory module which includes a plurality of integrated circuit memory packages, each memory package including an integrated circuit die within a protective casing. The integrated circuit memory packages are stacked, adhered to each other and connected, through in-line leads which extend from an edge of each package, to a printed circuit board. No additional enclosure is required.

The present invention provides a system and method for dissipating heat from a ultra high-density memory module while selectively controlling warpage through equalization of thermally affected structural forces. Heat is dissipated from each package through a substantially planar, external, thermally conductive element mounted externally to a major surface of the package. An internal lead frame disposed within the casing and overlaying a portion of the internal die functions to provide package stiffness in a preferred embodiment, and may be used to improved thermal conductivity in applications manifesting extreme heat stress. Rigidity may be further controlled through an optional substantially planar internal element that may also be chosen to dissipate heat for extreme applications.

An external, thin warp-resistant metal layer, typically INVAR, mounted to an external major surface of the package exterior provides equalization of structural forces contributed by the external thermally conductive element mounted on an opposite planar surface. The thin warp-resistant metal layer, the externally mounted thermally conductive element, the lead frame and the optional internal element cooperate to control structural forces within the package. Thus, each memory package has structurally balanced, warpage and heat control layers.

The heat conduction elements of the invention may be preferentially exposed from one end of the package to provide a platform suitable for heat extraction through an added heat pipe or conduction apparatus. After a plurality of packages are vertically stacked and adhered together with a fracturable, or reworkable, adhesive to form an ultra high-density memory module, a heat conduction cap is attached to the conduction platform to contact thermally conductive elements disposed along the same edge of each package within the memory module. In a preferred embodiment, a thermally conductive grease is applied between the platform and heat pipe or conduction cap to improve thermal conductivity away from the package. The platform may be spring-biased for better contact. The heat conduction cap may be cooled by liquid nitrogen, liquid oxygen, or other super-cooled gas, or may be a finned or unfinned heat sink.

In order to achieve an extremely high-density memory bank for computers or other applications requiring large on-board memories, a plurality of ultra high-density memory modules may be grouped together. The modules may be separated from each other by a spacer gap in order to facilitate heat transfer and easy removal of individual memory modules for maintenance purposes.

Typically, each memory module includes ten high-density integrated circuit memory packages. If one of the memory packages is defective, the module containing the defective package can be removed from the printed circuit board without effecting the remaining high-density memory modules. The defective package is separated from the remaining packages in the module. After the defective package is replaced, the individual packages are re-adhered to each other with fracturable adhesive, and then inserted back into the printed circuit board as a module.

The above embodiments of the present invention improve the thermal conductivity between the integrated circuit memory package of each module and the external environment. The present invention also improves packaging density and heat dissipation characteristics of high-density memory modules.

In contrast to prior art technology, the fabrication method and apparatus of the present invention also provides warp-resistant ultra-high density integrated circuit memory modules that are thermally and mechanically balanced to prevent the ultra-thin profile packages that comprise the modules, and the modules themselves, from warping.

In an alternative embodiment, a thin layer of material with a coefficient of thermal expansion that is greater than the coefficient of thermal expansion of silicon and preferably approximately equal to that of the casing material is mounted to an exterior major surface of the integrated circuit package to prevent warping. The material with a coefficient of thermal expansion that is greater than that of silicon may be, for example, aluminum or copper.

In a preferred embodiment, to prevent warpage, a thin layer of material with a coefficient of thermal expansion that is less than the coefficient of thermal expansion of silicon, for example INVAR, is mounted to an exterior major surface of the integrated circuit package with a high temperature epoxy.

The thickness of the layers of the materials mounted to the exterior major surfaces of the integrated circuit package depends on the resulting thermal balance throughout the package to avoid warping of the integrated circuit package. When the integrated circuit package is cooled after it is cured, it tends to warp due to thermal imbalances in the different materials that make up the layers of the integrated circuit package. This tendency to warp increases as the integrated circuit package is made thinner. Unless warpage is controlled, the molded package will bend unacceptably upon cooling from its bonding temperature to cooler storage and operational temperatures. An unacceptable level of warping may be as little as one mil but certainly includes three mils. This level of warping detracts from the integrity of the package and may induce cracking in the die.

A potential for package bow results from the method of package construction which utilizes stacked layers of different materials, with each material exhibiting a different coefficient of thermal expansion (CTE). Each material layer, upon cooling, seeks its new dimensions according to its CTE, but is restrained by the presence of the other material layers which make up the assembly. The forces produced by these restraining layers, if not minimized and balanced by proper design, materials selection, and construction, can produce undesirable warpage.

A thin, warp resistant layer, such as INVAR for example, is mounted to only selected packages within each module, but functions to control warpage of the entire module.

The present invention provides a method of warpage control that minimizes the differential thermal expansion forces and moments between the material layers on either side of a neutral thermodynamic axis in the assembly. The neutral thermodynamic axis is chosen for convenience to be the plane through the center of the lead frame. The total warpage-causing moments on either side of the neutral thermodynamic axis are the sum of the moments associated with each layer, relative to the neutral thermodynamic axis. For a particular layer, the moment, m, is proportional to the following product:

$$m \approx (E)(h)(t)\Delta(a)\Delta(T)$$

where m is the moment of the layer; E is the Young's modules of elasticity of the layer material; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

The product $\Delta(a)\Delta(T)$ is the source of forces and moments, the product $(E)(t)$ is the deflection compliance of the layer with the differential force, and h is the lever arm allowing the force to produce a moment with its resulting warpage.

The product in the above equation, for moment, m, is evaluated for each layer on one side of the neutral thermodynamic axis and these values summed. The process is repeated for the layers on the opposite side of the neutral thermodynamic axis and the two sums compared. The package materials and dimensions are then adjusted until the sums are either equal or acceptably close enough in value to assure acceptably low values of warpage. In other words, the vectorial summation of all of the moments of each layer is as close to zero as possible.

An advantage of the present invention is that one can asymmetrically locate elements formed of different materials in the package and thermally balance them. Thus the integrated circuit die does not have to be symmetrically centered in the package to obtain thermal balance throughout the integrated circuit package. Application of the method of the present invention compensates for material and orientation asymmetries in the integrated circuit package to prevent warping.

Other and further objects, features and advantages will be apparent from the following description of the presently preferred embodiment of the invention, given for the purpose of disclosure and taken in conjunction with the accompanying drawings.

BRIEF DESCRIPTION OF THE DRAWINGS

A better understanding of the present invention can be obtained when the following detailed description is read in conjunction with the following drawings in which.

DETAILED DESCRIPTION OF THE PREFERRED EMBODIMENT

Figure 1:
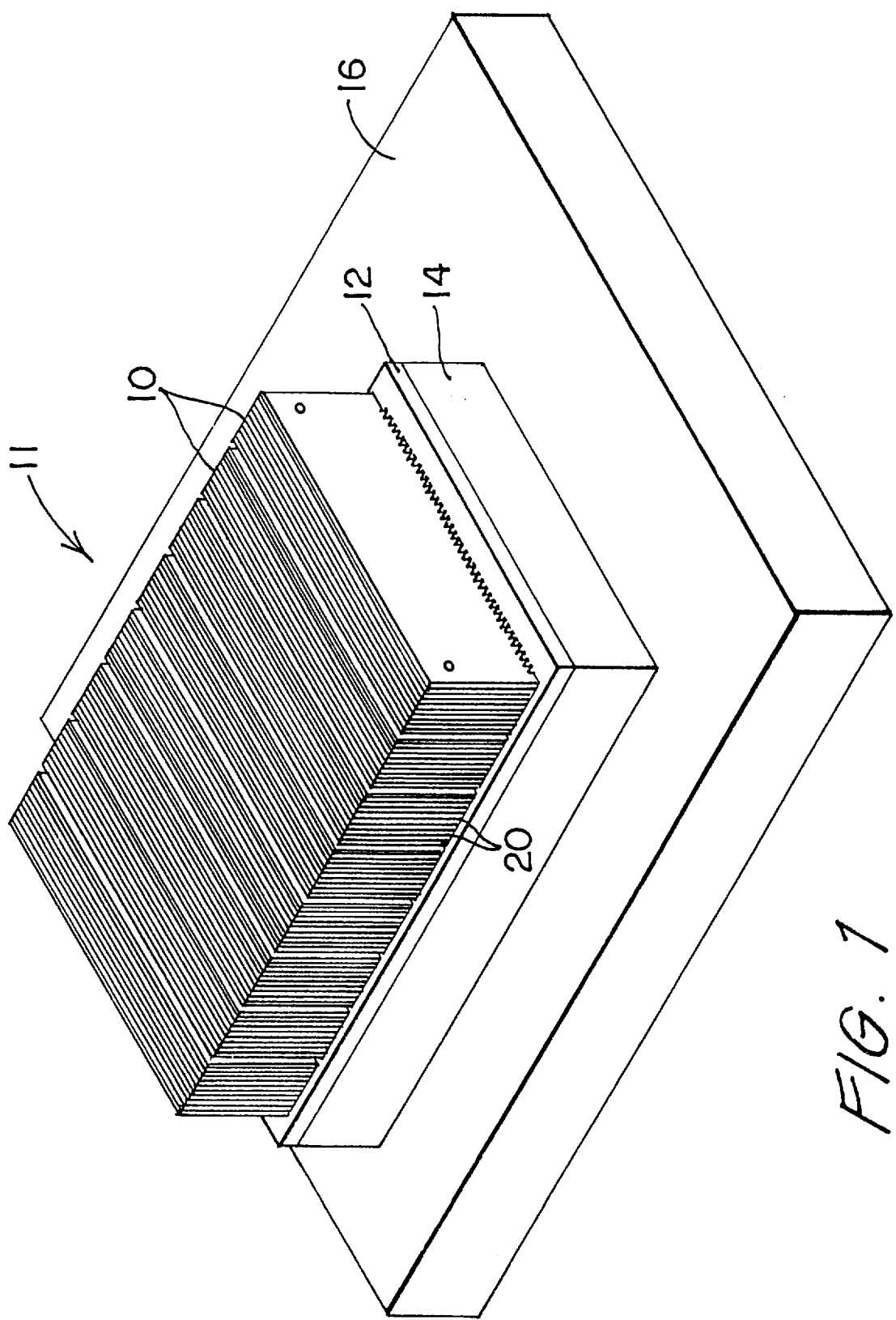
FIG. 1 is a perspective view of the ultra high-density memory package, comprised of ultra high-density memory modules, of the present invention.
Figure 2:
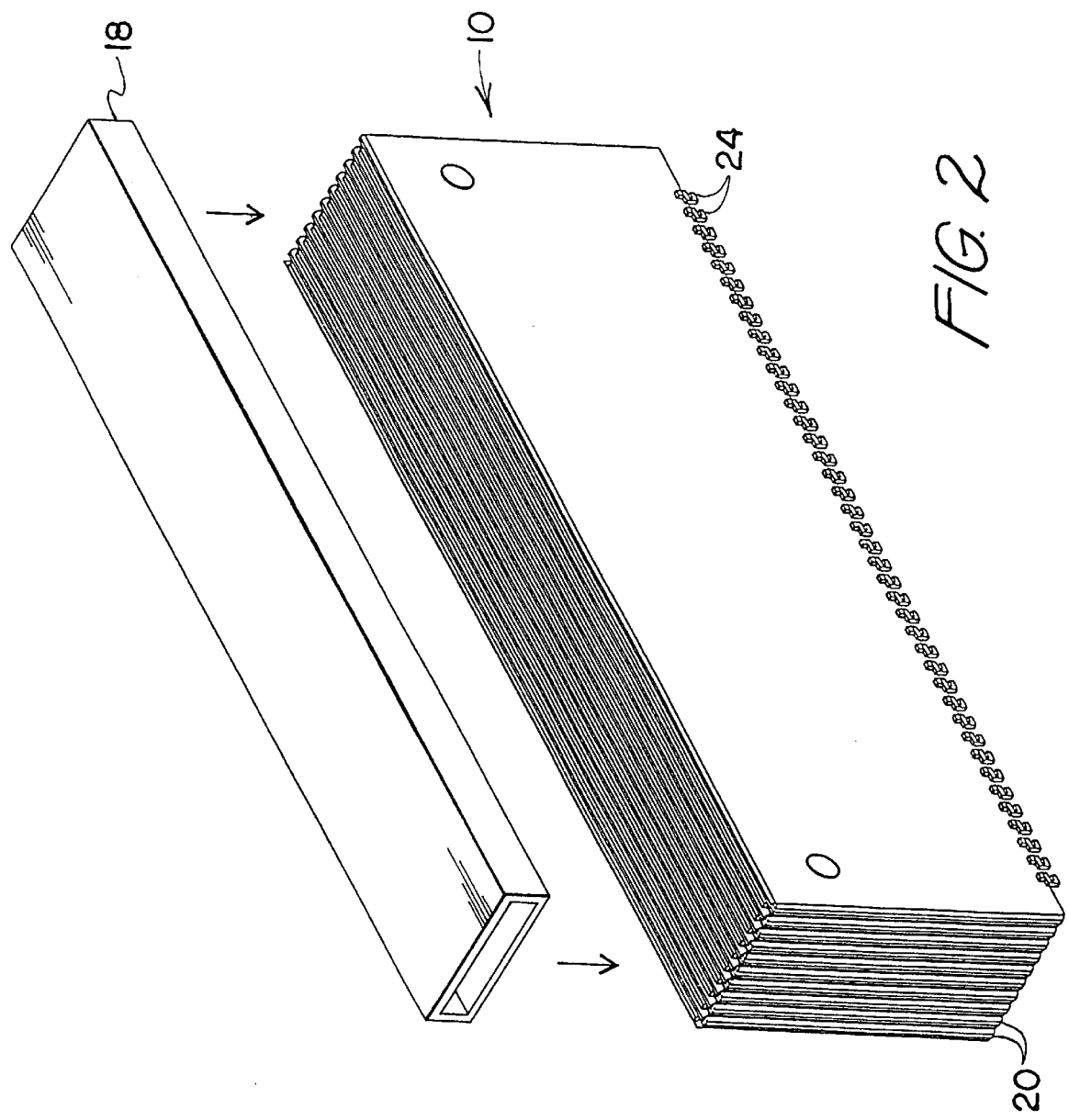
FIG. 2 is a perspective view of an ultra high-density memory module and thermally conductive cap of the present invention.

FIG. 1 illustrates an ultra high-density memory bank 11 formed of a plurality of ultra high density memory modules 10. Each memory module 10 is formed of a plurality of individual high-density integrated circuit memory packages 20. As shown in FIG. 2, the leads 24 of each high-density memory package 20 project from one end of each package 20 in an in-line configuration.

The memory modules 10 may be electrically connected to a mounting header 12 (FIG. 1) for electrical interconnection to circuit board 16 via electrical conductor platform 14. Platform 14 is omitted in one configuration, whereby electrical connection between mounting header 12 and circuit board 16 is made directly. In other configurations, electrical interconnections between leads 24 of packages 20 of modules 10 may be made directly to circuit board 16.

Figure 3:
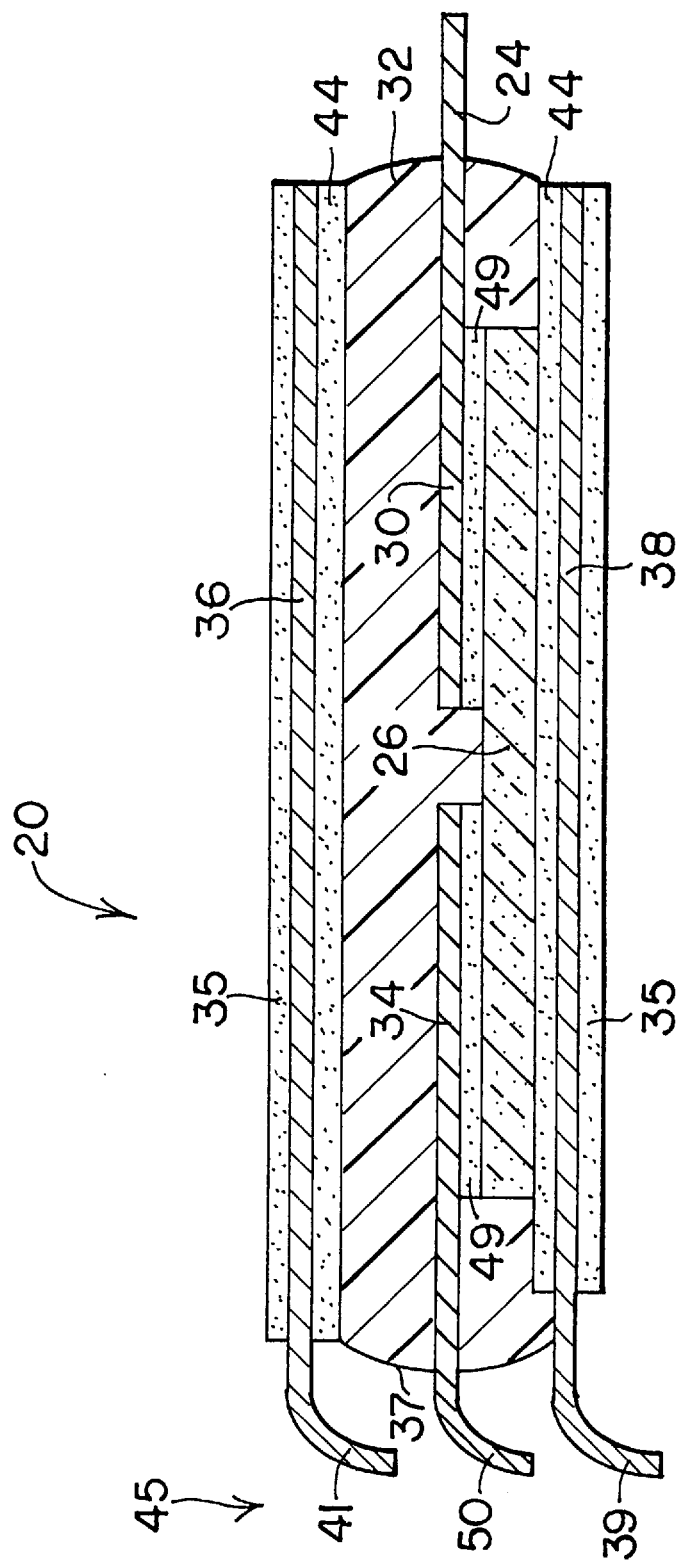
FIG. 3 illustrates a cross-sectional view of an alternative embodiment of the high-density memory package of the present invention.

As illustrated in FIG. 3, each package 20 includes an internal integrated circuit die 26. A substantially planar internal lead frame 30 overlays a portion of die 26 to provide thermal coupling and structural rigidity. In a preferred embodiment, lead frame 30 is alloy 42 (42% nickel, 58% iron). Although less efficient in heat dissipation than other materials such as copper for example, alloy 42 provides the advantage of added rigidity where heat dissipation is adequately controlled through the other heat dissipating members disclosed herein. Where the modules are used in applications having extreme thermal stress, those skilled in the art will recognize that design trade-offs may dictate a preferable lead frame member composed of a copper alloy rather than alloy 42.

As depicted in FIG. 3, connectors from lead frame 30 extend through an edge of casing 32 to form leads 24. Optionally, a substantially planar internal element 34, preferably also composed of alloy 42 (or copper where heat stress is extreme), may be overlaid a substantial portion of die 26 to provide additional rigidity. Element 34 may be a joined extension of lead frame 30, or as depicted in FIG. 3, a separate element mounted to the same major surface of die 26 as internal lead frame 30. In other embodiments, internal lead frame 30 and optional internal element 34 may be mounted to opposite major surfaces of die 26. In a preferred embodiment, protective casing 32 envelopes internal lead frame 30 and optional internal element 34 and the surface area of die 26.

Figure 4:
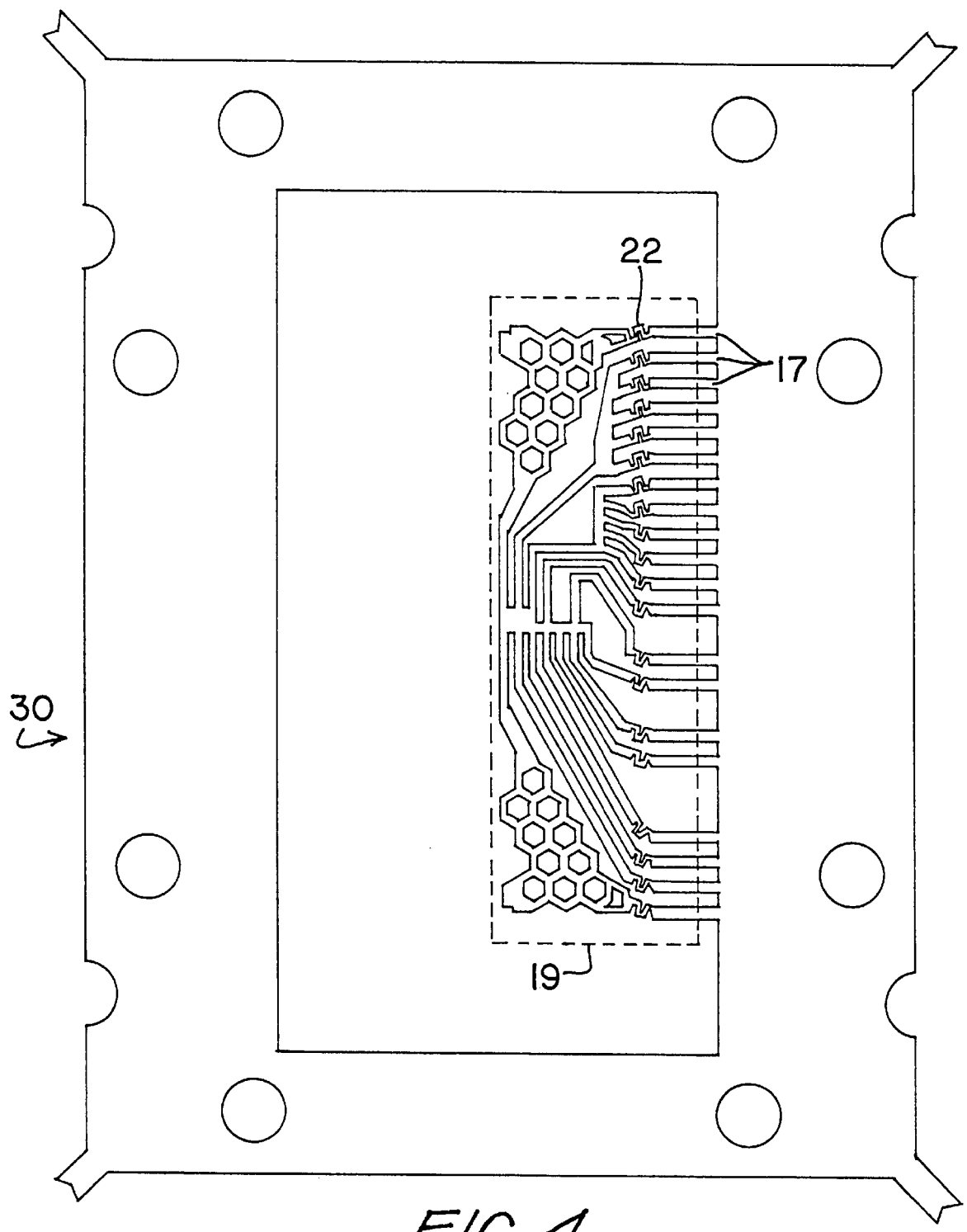
FIG. 4 is a plan view of an internal lead frame having "S" shaped strain relief portions.

FIG. 4 illustrates a plan view of a substantially planar internal lead frame 30 in accordance with the present invention. FIG. 4 is presented for illustration purposes and is not meant to delimit lead frame configurations useable in accordance with the present invention. Lead frame 30 includes "S" shaped relief portions 22 to provide strain relief for lead frame conductors 17 such that temperature cycling conditions within the protective casing 32 will not cause lead frame conductors 17 to break electrical connection with the terminals (not shown) of die 26 to which conductors 17 are connected. Hashed outline 19 represents the approximate finished size of internal lead frame 30 after it is stamped or cut to form leads 24 (FIG. 3) on the distal ends of lead frame conductors 17. The strain relief portion is preferably formed in each lead frame conductor 17 between said conductor distal end, which includes the lead 24, and the die bond end where the conductor 17 is electrically connected to die 26.

Integrated circuit memory package 20 is preferably thin, and without the preventive measures described herein could warp during fabrication or use due to dissimilar coefficients of thermal expansion in the various layers or component parts which comprise package 20. As illustrated in FIG. 3, to prevent warping while still maintaining a thin profile, a thin, warp-resistant metal layer 36 having a coefficient of thermal expansion less than that of silicon is mounted to a major surface of each integrated circuit package 20. Thin warp-resistant metal layer 36 is mounted to an outer major surface of casing 32. Metal layer 36 is preferably INVAR.

Figure 5:
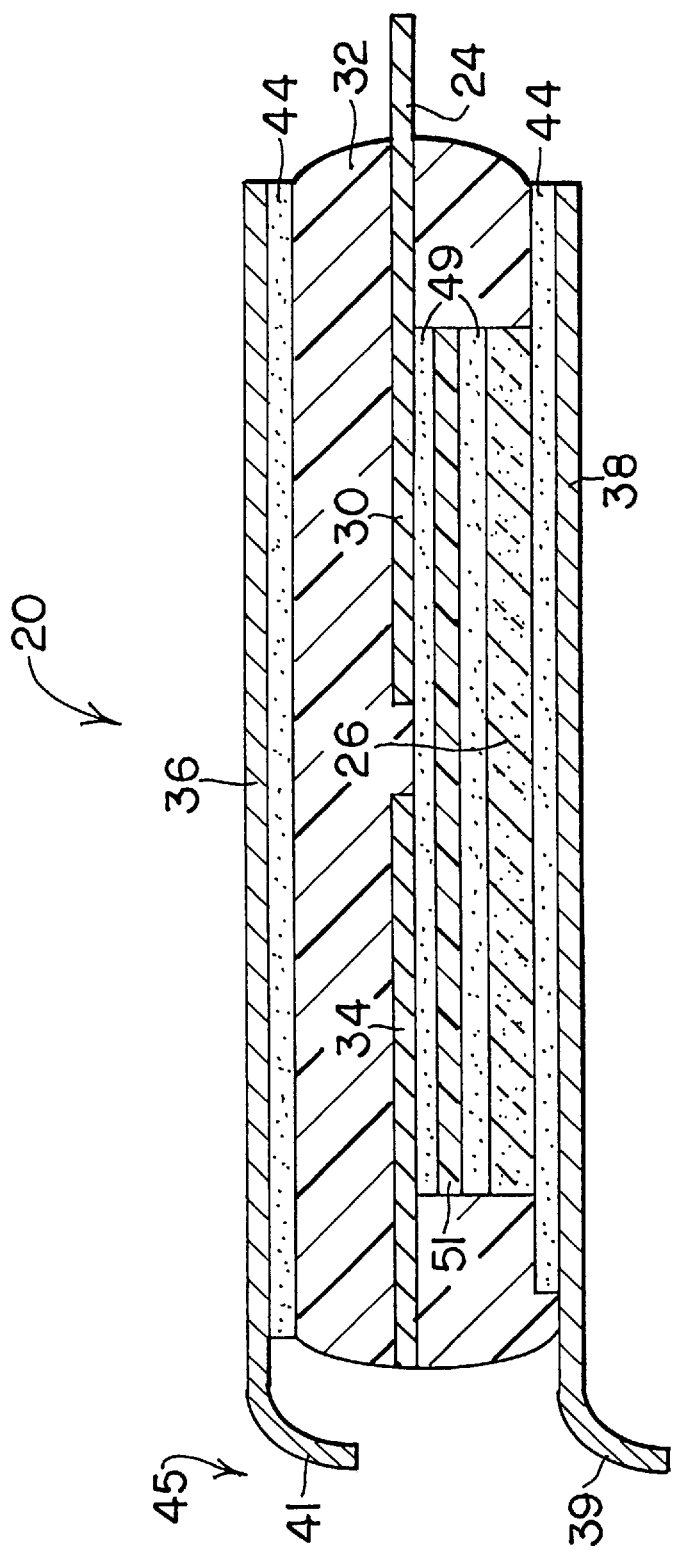
FIG. 5 illustrates a cross-sectional view of a further embodiment of the high-density memory package of the present invention having two-sided tape mounted to the die.

A substantially planar external thermally conductive element 38 is mounted to and is in thermal contact with an opposite outer major surface of package 20. As depicted in FIG. 3 and FIG. 5, external thermally conductive element 38 is preferably mounted in close contact with die 26 as exposed through casing 32 in contemporary ultra high-density devices such as those offered commercially by the assignee of the present invention. Element 38 is a thin sheet of copper 110 alloy or, alternatively, a laminate composed of alternating Cu/INVAR/Cu layers.

In other embodiments, only selected packages 20 within module 10 include a thin, warp-resistant layer 36 mounted to a major exterior surface. In these embodiments, the CTE of the material used for metal layer 36 is selected to thermally balance and make warp-resistant the entire module 10 without requiring a metal layer 36 on each package 20 within the module 10.

The present invention provides a method of warpage control that minimizes the differential thermal expansion forces and moments between the material layers on either side of a neutral thermodynamic axis in the assembly. The neutral thermodynamic axis is chosen for convenience to be the plane through the center of the lead frame. The total warpage-causing moments on either side of the neutral thermodynamic axis are the sum of the moments associated with each layer, relative to the neutral thermodynamic axis. For a particular layer, the moment, m, is proportional to the following product:

$$m \approx (E)(h)(t)\Delta(a)\Delta(T)$$

where m is the moment of the layer; E is the Young's modules of elasticity of the layer material; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

The product $\Delta(a)\Delta(T)$ is the source of forces and moments, the product $(E)(t)$ is the deflection compliance of the layer with the differential force, and h is the lever arm allowing the force to produce a moment with its resulting warpage.

The product in the above equation, for moment, m, is evaluated for each layer on one side of the neutral thermodynamic axis and these values summed. The process is repeated for the layers on the opposite side of the neutral thermodynamic axis and the two sums compared. The package materials and dimensions are then adjusted until the sums are either equal or acceptably close enough in value to assure acceptably low values of warpage. In other words, the vectorial summation of all of the moments of each layer is as close to zero as possible.

An advantage of the present invention is that one can asymmetrically locate elements formed of different materials in each package 20 and thermally balance them. Thus, integrated circuit die 26 does not have to be symmetrically centered in the package 20 to obtain thermal balance throughout each package 20. Application of the method of the present invention allows compensation for material and orientation asymmetries in each package 20 to prevent warping.

As shown in FIG. 3, an end portion 39 of external thermally conductive element 38 extends outward beyond edge 37 of casing 32. Warp resistant layer 36 is also depicted with an edge portion 41 configured to create a platform area 45 suitable for contact with a heat conduction pipe or cap. When copper is used as lead frame 30 and optional element 34, element 34 may also have an extended edge conformal to the platform 45. Together, end portions 41 and 39 form platform 45, the edge portions being outwardly spring-biased.

A heat conduction cap 18 (FIG. 2) is mounted to platform 45, formed of the contact area of end portions 39 and 41 (FIG. 3). A thermal grease is preferably used to provide a heat transfer conduit from platform area 45 to cap 18. End portions 39 and 41 are spring-biased to provide better mechanical and thermal contact through the thermal grease between platform 45 and cap 18. Cap 18 is provided for additional heat dissipation and is preferably made of metal or other thermally conductive material. For maximum heat dissipation, cap 18 may be cooled by liquid nitrogen, liquid oxygen or other super-cooled gas. Alternatively, cap 18 may also include fins or other form of conventional heat sinks.

As shown in FIG. 3, epoxy layer 44, preferably Able Film™ or Ablelog™, is used to mount thin, warp-resistant metal layer 36 to an outer major surface of casing 32. Likewise, a layer of epoxy 44 is used to mount external thermally conductive element 38 to an opposite outer major surface of each package 20. As depicted in FIG. 3, external thermally conductive element 38 is preferably mounted in close contact with die 26 as exposed through casing 32 in contemporary ultra high-density devices such as those offered commercially by the assignee of the present invention. A compliant adhesive, such as phenolic butyral epoxy, may be used to relieve stress caused by dissimilar thermal expansion of the lead frame 30 and die 26.

In other embodiments, as shown in FIG. 5, a two-sided polyimide film 51, such as KAPTON by DuPont, having a thin layer of high temperature epoxy 49 applied to both sides of film 51, is used to mount internal lead frame 30 and/or internal element 34 to die 26. The high temperature adhesive may be epoxy, such as Rogers Corp. R/flex (R) 8970 which is B-staged phenolic butyral epoxy, that may be laminated at a temperature of about 130° C. and cured at a temperature of about 175° C.

Referring now to FIG. 2, ultra high-density memory modules 10 are assembled from a plurality of individual packages 20. Packages 20 are vertically oriented and mounted to one another such that a major surface of each is mounted to and is in thermal contact with a major surface of an adjacent package. Each module 10 is assembled so leads 24 of the individual packages 20 are aligned with adjacent corresponding leads of adjacent packages 20, forming a grid array. Preferably, ten individual packages 20 are mounted to one another to form a high-density memory module 10. A thin layer of fracturable adhesive 35 (FIG. 3) is applied to the exterior major surface of the external thermally conductive element 38 and/or the exterior surface of thin, warp-resistant metal layer 36 of each individual package 20 within each high-density memory module 10. The packages 20 are mounted such that the end portion 39 of the external thermally conductive element 38 of one package and the end portion 41 of the thin metal warp-resistant layer 36 of an adjacent package at least partially overlap and are in contact with each other.

Fracturable or reworkable form of adhesive 35 is used to form the modules 10 so a defective package may be easily replaced. Once a defective package is isolated to a certain memory module 10, the memory module 10 is unsoldered from mounting header 12 or from circuit board 16, depending on how the leads are connected. The individual package 20 within the defective module 10 can then be identified. The individual packages 20 on either side of the defective package 20 within the module 10 may then be separated from the defective package by applying lateral pressure to crack the fracturable, or reworkable, adhesive layer 35. Once the defective package 20 has been replaced, a new layer of fracturable adhesive 35 may be applied to the major surfaces of the packages separated, as stated previously, and the module 10 may then be reassembled. The repaired module 10 is then reinserted and reconnected to mounting header 12 or to circuit board 16.

The foregoing disclosure and description of the invention are illustrated and explanatory of the preferred embodiments, and changes in the size, shape, materials and individual components, circuit elements, connections and construction may be made without departing from the spirit of the invention.

What is claimed is:

1. An ultra-high density memory module of the type having in-line leads, comprising:

a plurality of high density memory integrated circuit packages, wherein each package comprises:

an integrated circuit die;

a substantially planar internal lead frame mounted to at least a portion of said die, said internal lead frame having a plurality of electrical conductors electrically connected to said die;

a protective casing covering said die and said internal lead frame, wherein a plurality of said conductors extend from said internal lead frame, as leads, through a first edge of said casing;

a thin, substantially planar external thermally conductive element mounted to a major exterior surface of said package;

wherein at least one of said packages includes a thin, warp resistant layer mounted to a major exterior surface of said package opposite said external thermally conductive element;

wherein said packages are vertically oriented and mounted to one another to form said module.

2. The module of claim 1, wherein at least one of said packages includes a substantially planar thermally conductive internal element within said casing which overlays and is in thermal contact with a portion of said die.

3. An ultra-high density memory module, comprising:

a plurality of high density memory integrated circuit packages, wherein each package comprises:

an integrated circuit die;

a substantially planar internal lead frame having a plurality of electrical conductors electrically connected to said die;

a protective casing covering said die and said internal lead frame, wherein a plurality of said conductors extend from said internal lead frame, as leads, through a first edge of said casing; and a substantially planar thermally conductive internal element within said casing which is in thermal contact with at least a portion of said die.

4. The ultra-high density memory module of claim 3, further comprising:

a substantially planar external thermally conductive element mounted to an exterior major surface of said casing;

wherein said thermally conductive internal element is attached to said die with a two-sided polyimide tape;

wherein said thin, warp-resistant metal layer is attached to said casing with a thin layer of epoxy;

wherein said external thermally conductive element is attached to said casing with a thin layer of epoxy;

wherein a thin, warp-resistant metal layer is mounted to an exterior major surface of said casing of at least one of said packages, said metal layer being mounted opposite said external thermally conductive element; and wherein said packages are vertically oriented and mounted to one another to form said module.

* * * * *

UNITED STATES PATENT AND TRADEMARK OFFICE
CERTIFICATE OF CORRECTION

PATENT NO. : 5,828,125
DATED : October 27, 1998
INVENTOR(S) : Carmen D. Burns

It is certified that error appears in the above-identified patent and that said Letters Patent is hereby corrected as shown below:

Column 1, line 46, after "assigned" insert -- U.S. Pat. No. 5,484,959 --.
Column 2, line 11, delete "pending" and insert -- U.S. Pat. No. 5,448,450 --.
Column 2, line 38, after "INVAR", insert -- an iron-nickel based allow consisting essentially of about 63% iron and 46% nickel, --

Column 3, line 37, after "INVAR", insert -- an iron-nickel based allow consisting essentially of about 63% iron and 46% nickel, --

Column 3, line 65, after "INVAR", insert -- an iron-nickel based allow consisting essentially of about 63% iron and 46% nickel, --

Column 4, line 63, delete "an alternative" and insert -- a preferred --.

Column 5, line 61, delete "Hashed" and insert -- Hatched --.

Column 6, line 11, after "INVAR", insert -- an iron-nickel based allow consisting essentially of about 63% iron and 46% nickel, --

Column 6, line 21, delete "layers." and insert -- where INVAR is an iron-nickel based allow consisting essentially of about 63% iron and 46% nickel, --

Column 7, line 17, after "biased." insert -- Element 34 may also have an end portion 50 which extends through edge 37 of casing 32 and may be formed to be a part of platform 45. --.

UNITED STATES PATENT AND TRADEMARK OFFICE
CERTIFICATE OF CORRECTION

PATENT NO. : 5,828,125
DATED : October 27, 1998
INVENTOR(S) : Carmen D. Burns

It is certified that error appears in the above-identified patent and that said Letters Patent is hereby corrected as shown below:

Column 7, line 30, delete "Able"

Column 7, line 31, delete "Film™" and insert -- ABLEFILM --.

Column 7, line 31, delete "Ablelog ™" and insert -- ABLELOG --.

Signed and Sealed this

Fourth Day of July, 2000

Attest:

Q. TODD DICKINSON

*Attesting Officer*       *Director of Patents and Trademarks*